(12) United States Patent
Zhou et al.

(10) Patent No.: US 11,660,816 B2
(45) Date of Patent: May 30, 2023

(54) REGULATING RESIN TEMPERATURE BY RECIRCULATING ON HOT OR COLD SIDE OF PELTIER EFFECT BLOCK

(71) Applicant: SHENZHEN ANYCUBIC TECHNOLOGY CO.,LTD., Shenzhen (CN)

(72) Inventors: Chengli Zhou, Shenzhen (CN); Xin Ouyang, Shenzhen (CN)

(73) Assignee: SHENZHEN ANYCUBIC TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/449,267

(22) Filed: Sep. 29, 2021

(65) Prior Publication Data

US 2022/0134664 A1 May 5, 2022

(30) Foreign Application Priority Data

Nov. 3, 2020 (CN) .......................... 202011210454.3

(51) Int. Cl.
*B29C 64/321* (2017.01)
*B33Y 30/00* (2015.01)
(Continued)

(52) U.S. Cl.
CPC .......... *B29C 64/321* (2017.08); *B29C 64/295* (2017.08); *B29C 64/386* (2017.08); *B29C 64/393* (2017.08); *B33Y 30/00* (2014.12); *B33Y 40/00* (2014.12); *B33Y 40/10* (2020.01); *B33Y 50/00* (2014.12); *B33Y 50/02* (2014.12); *H10N 10/10* (2023.02)

(58) Field of Classification Search
CPC .............................. B29C 64/321; H01L 35/28
See application file for complete search history.

(56) References Cited

U.S. PATENT DOCUMENTS

| 6,401,462 | B1 * | 6/2002 | Bielinski ................. F25B 21/02 |
| | | | 62/3.6 |
| 10,596,755 | B2 | 3/2020 | DeSimone |

(Continued)

FOREIGN PATENT DOCUMENTS

| CN | 109532002 A | | 3/2019 |
| CN | 110936609 A | * | 3/2020 |

(Continued)

*Primary Examiner* — Leith S Shafi
*Assistant Examiner* — Nicholas J Chidiac
(74) *Attorney, Agent, or Firm* — Bayramoglu Law Offices LLC

(57) ABSTRACT

A feeding device and a 3D printer are provided. The feeding device includes a first connecting pipe, a second connecting pipe, a feeding power unit, a temperature adjusting device and a resin vat containing a resin liquid. The temperature adjusting device includes a heat exchange pipeline, a liquid intake end of the heat exchange pipeline is connected to a first end of the first connecting pipe, a liquid output end of the heat exchange pipeline is connected to a first end of the second connecting pipe, a second end of the first connecting pipe and a second end of the second connecting pipe are both located in the resin vat, and at least one of the first connecting pipe and the second connecting pipe is provided with the feeding power unit.

14 Claims, 1 Drawing Sheet

(51) Int. Cl.
   *B29C 64/295*   (2017.01)
   *B29C 64/393*   (2017.01)
   *B33Y 40/10*    (2020.01)
   *B33Y 50/02*    (2015.01)
   *H10N 10/10*    (2023.01)
   *B33Y 40/00*    (2020.01)
   *B33Y 50/00*    (2015.01)
   *B29C 64/386*   (2017.01)

(56)               References Cited

U.S. PATENT DOCUMENTS 11,220,060 B2 *   1/2022  Wang ................. B33Y 30/00
   11,497,275 B2 *  11/2022  Busbee ............... B01F 27/117
   11,498,274 B2 *  11/2022  Mohsenizadeh ....... B33Y 50/00
   2019/0009474 A1 *  1/2019  Wang ................. G05D 23/30
   2019/0037969 A1 *  2/2019  Busbee ............... D06N 3/0088
   2019/0193326 A1    6/2019  Robeson
   2020/0055251 A1    2/2020  Medalsy
   2021/0387413 A1 * 12/2021  Mohsenizadeh ....... B33Y 10/00
   2022/0107099 A1 *  4/2022  Gerstenmeier ........ F25B 21/04
   2023/0038421 A1 *  2/2023  Mohsenizadeh ...... B29C 64/124

FOREIGN PATENT DOCUMENTS

CN        110936609 A     3/2020
   JP        2005131938 A    5/2005
   WO    WO-2018208799 A1 *  11/2018  .......... B29C 64/124
   WO    WO-2022090321 A1 *   5/2022

* cited by examiner

REGULATING RESIN TEMPERATURE BY RECIRCULATING ON HOT OR COLD SIDE OF PELTIER EFFECT BLOCK

CROSS REFERENCE TO THE RELATED APPLICATIONS

This application is based upon and claims priority to Chinese Patent Application No. 202011210454.3 filed on Nov. 3, 2020, the entire contents of which are incorporated herein by reference.

TECHNICAL FIELD

The present invention relates to the technical field of stereoscopic printing, and in particular to a feeding device and a 3D printer.

BACKGROUND 3D printers, also known as three-dimensional printers, are machines that use rapid prototyping technology, which construct three-dimensional objects from modeling materials by printing layer by layer on the basis of digital model files. The 3D printers have been widely used in industrial design, architecture, aerospace and other fields.

Printing materials for the 3D printers are generally engineering resins. During printing, there are strict requirements on the temperature of a resin liquid. If the temperature of the resin liquid is too high or too low, the final printing effect will be affected.

SUMMARY

Objectives of embodiments of the present invention are to provide a feeding device and a 3D printer, so as to solve the technical problem whereby the existing 3D printers cannot accurately control the temperature of the resin liquid, resulting in a poor printing effect.

In order to achieve the above objectives, an embodiment of the present invention provides a feeding device, including a first connecting pipe, a second connecting pipe, a feeding power unit, a temperature adjusting device and a resin vat containing a resin liquid.

The temperature adjusting device includes a heat exchange pipeline, a liquid intake end of the heat exchange pipeline is connected to a first end of the first connecting pipe, a liquid output end of the heat exchange pipeline is connected to a first end of the second connecting pipe, a second end of the first connecting pipe and a second end of the second connecting pipe are both located in the resin vat, and at least one of the first connecting pipe and the second connecting pipe is provided with the feeding power unit.

When the temperature of the resin liquid is higher than a preset temperature, the feeding power unit delivers the resin liquid from the resin vat to the heat exchange pipeline through the first connecting pipe to cool the resin liquid to obtain a cooled resin liquid, and delivers the cooled resin liquid back to the resin vat through the second connecting pipe. When the temperature of the resin liquid is lower than the preset temperature, the feeding power unit delivers the resin liquid from the resin vat to the heat exchange pipeline through the first connecting pipe to heat the resin liquid to obtain a heated resin liquid, and delivers the heated resin liquid back to the resin vat through the second connecting pipe.

Optionally, the feeding power unit includes a first water pump provided at an outer wall of the resin vat, the heat exchange pipeline includes a first heat exchange sub-pipeline, the first connecting pipe includes a first connecting sub-pipe and a second connecting sub-pipe, and the second connecting pipe includes a third connecting sub-pipe.

A first end of the first connecting sub-pipe is located in the resin vat, and a second end of the first connecting sub-pipe is connected to a liquid intake end of the first water pump.

A first end of the second connecting sub-pipe is connected to a liquid output end of the first water pump, and a second end of the second connecting sub-pipe is connected to a liquid intake end of the first heat exchange sub-pipeline.

A first end of the third connecting sub-pipe is connected to a liquid output end of the first heat exchange sub-pipeline, and a second end of the third connecting sub-pipe is located in the resin vat.

Optionally, the temperature adjusting device includes a refrigeration module. The refrigeration module includes a cooling block and a refrigeration component.

The cooling block is provided on a first side of the first heat exchange sub-pipeline, and the refrigeration component is provided on a second side of the first heat exchange sub-pipeline.

Optionally, the refrigeration component includes a refrigeration side of a semiconductor, and the semiconductor is composed of at least two different semiconductor materials.

Optionally, the feeding power unit includes a second water pump provided at an outer wall of the resin vat, the heat exchange pipeline includes a second heat exchange sub-pipeline, the first connecting pipe includes a fourth connecting sub-pipe and a fifth connecting sub-pipe, and the second connecting pipe includes a sixth connecting sub-pipe.

A first end of the fourth connecting sub-pipe is located in the resin vat, and a second end of the fourth connecting sub-pipe is connected to a liquid intake end of the second water pump.

A first end of the fifth connecting sub-pipe is connected to a liquid output end of the second water pump, and a second end of the fifth connecting sub-pipe is connected to a liquid intake end of the second heat exchange sub-pipeline.

A first end of the sixth connecting sub-pipe is connected to a liquid output end of the second heat exchange sub-pipeline, and a second end of the sixth connecting sub-pipe is located in the resin vat.

Optionally, the temperature adjusting device includes a heating module. The heating module includes a heat sink, a fan and a heating component.

The heating component is provided on a first side of the second heat exchange sub-pipeline, the heat sink is provided on a second side of the second heat exchange sub-pipeline, the fan is provided on a side of the heat sink away from the second heat exchange sub-pipeline, and the side of the heat sink away from the second heat exchange sub-pipeline has a relief shape.

Optionally, the heating component includes a heating side of a semiconductor, and the semiconductor is composed of at least two different semiconductor materials.

Optionally, the feeding device further includes a temperature sensor provided at an outer wall of the resin vat.

The temperature sensor is configured to detect the temperature of the resin liquid in the resin vat.

Optionally, the feeding device further includes a controller in communication connection with the temperature sensor and the feeding power unit.

The controller is configured to obtain the temperature detected by the temperature sensor.

When the temperature of the resin liquid is higher than the preset temperature, the feeding power unit is driven. When the temperature of the resin liquid is lower than the preset temperature, the feeding power unit is driven.

An embodiment of the present invention further provides a 3D printer, the 3D printer including the feeding device as described above.

One of the above technical solutions has the following advantages or beneficial effects:

In the embodiments of the present invention, when the temperature of the resin liquid is higher than a preset temperature, the feeding power unit delivers the resin liquid from the resin vat to the heat exchange pipeline through the first connecting pipe to cool the resin liquid to obtain a cooled resin liquid, and delivers the cooled resin liquid back to the resin vat through the second connecting pipe, when the temperature of the resin liquid is lower than the preset temperature, the feeding power unit delivers the resin liquid from the resin vat to the heat exchange pipeline through the first connecting pipe to heat the resin liquid to obtain a heated resin liquid, and delivers the heated resin liquid back to the resin vat through the second connecting pipe. That is, when the temperature of the resin liquid is higher than a preset temperature, the resin liquid is cooled to reduce the temperature of the resin liquid, when the temperature of the resin liquid is lower than the preset temperature, the resin liquid is heated to increase the temperature of the resin liquid. In this way, the temperature of the resin liquid in the resin vat is controlled to be within an ideal temperature range, thereby improving the printing effect.

DETAILED DESCRIPTION OF THE EMBODIMENTS

The technical solutions in the embodiments of the present invention will be clearly and completely described below in conjunction with the accompanying drawings in the embodiments of the present invention. Apparently, the embodiments described are some rather than all of the embodiments of the present invention. On the basis of the embodiments of the present invention, all the other embodiments obtained by those of ordinary skill in the art without creative efforts shall fall within the scope of protection of the present invention.

Figure 1:
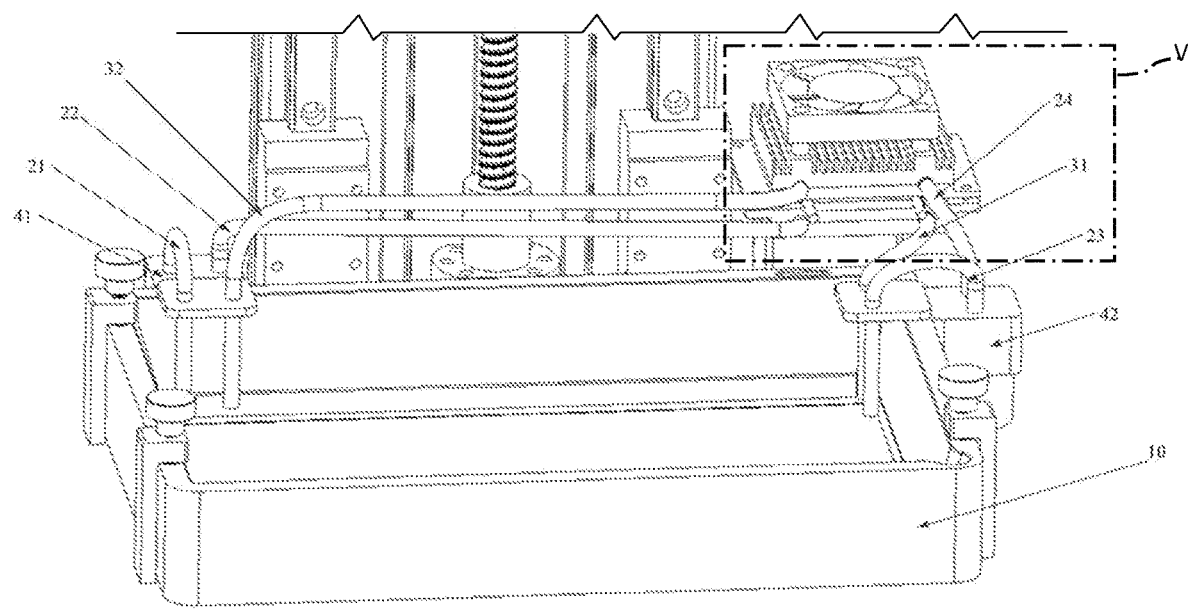
FIG. 1 is a structural diagram of a feeding device provided by an embodiment of the present invention.

As shown in FIG. 1, an embodiment of the present invention provides a feeding device. The feeding device may be understood as a device for delivering a resin liquid. The temperature of the resin liquid delivered by the feeding device is constant, which can improve the 3D printing effect.

The feeding device includes a first connecting pipe, a second connecting pipe, a feeding power unit, a temperature adjusting device and a resin vat 10 containing a resin liquid.

The temperature adjusting device includes a heat exchange pipeline, a liquid intake end of the heat exchange pipeline is connected to a first end of the first connecting pipe, a liquid output end of the heat exchange pipeline is connected to a first end of the second connecting pipe, a second end of the first connecting pipe and a second end of the second connecting pipe are both located in the resin vat 10, and at least one of the first connecting pipe and the second connecting pipe is provided with the feeding power unit.

The application principle of this embodiment is that when the temperature of the resin liquid in the resin vat 10 is higher than a preset temperature, the feeding power unit delivers the resin liquid from the resin vat 10 to the liquid intake end of the heat exchange pipeline through the first connecting pipe to cool the resin liquid, and the cooled resin liquid is delivered to the second connecting pipe through the liquid output end of the heat exchange pipeline and flows through the second connecting pipe back to the resin vat 10, thereby realizing a reduction of the temperature of the resin liquid in the resin vat 10.

When the temperature of the resin liquid in the resin vat 10 is lower than the preset temperature, the feeding power unit delivers the resin liquid from the resin vat 10 to the liquid pintake end of the heat exchange pipeline through the first connecting pipe to heat the resin liquid, and the heated resin liquid is delivered to the second connecting pipe through the liquid output end of the heat exchange pipeline and flows through the second connecting pipe back to the resin vat 10, thereby realizing an increase in the temperature of the resin liquid in the resin vat 10. Optionally, the preset temperature is set to 40 degrees, or the preset temperature is set as a temperature range.

Optionally, the first connecting pipe is provided with the feeding power unit, or the second connecting pipe is provided with the feeding power unit, or the first connecting pipe and the second connecting pipe are each provided with the feeding power unit, which is not specifically limited in this embodiment.

Further, the feeding device further includes a temperature sensor provided at an outer wall of the resin vat 10.

Optionally, the temperature sensor may be provided at an outer bottom of the resin vat 10, and the above-mentioned temperature sensor is configured to detect the temperature of the resin liquid in the resin vat 10.

Further, the feeding device further includes a controller in communication connection with the temperature sensor and the feeding power unit. The controller is configured to obtain the temperature detected by the temperature sensor. When the temperature of the resin liquid is higher than the preset temperature, the feeding power unit is driven. When the temperature of the resin liquid is lower than the preset temperature, the feeding power unit is driven.

Optionally, the controller may be a main control board inside the 3D printer, or may be a circuit board or other electronics that are independently provided. The controller drives, based on the temperature detected by the temperature sensor, the feeding power unit to work, in order to cool or heat the resin liquid.

In the embodiments of the present invention, when the temperature of the resin liquid is higher than a preset temperature, the feeding power unit delivers the resin liquid from the resin vat 10 to the heat exchange pipeline through the first connecting pipe to cool the resin liquid to obtain a cooled resin liquid, and delivers the cooled resin liquid back to the resin vat 10 through the second connecting pipe, when the temperature of the resin liquid is lower than the preset temperature, the feeding power unit delivers the resin liquid from the resin vat 10 to the heat exchange pipeline through the first connecting pipe to heat the resin liquid to obtain a heated resin liquid, and delivers the heated resin liquid back to the resin vat 10 through the second connecting pipe. That is, when the temperature of the resin liquid is higher than a preset temperature, the resin liquid is cooled to reduce the temperature of the resin liquid, when the temperature of the resin liquid is lower than the preset temperature, the resin liquid is heated to increase the temperature of the resin liquid. In this way, the temperature of the resin liquid in the resin vat 10 is controlled to be within an ideal temperature range, thereby improving the printing effect.

Further, the feeding power unit includes a first water pump 41 provided at an outer wall of the resin vat 10, the heat exchange pipeline includes a first heat exchange sub-pipeline, the first connecting pipe includes a first connecting sub-pipe 21 and a second connecting sub-pipe 22, and the second connecting pipe includes a third connecting sub-pipe 31. A first end of the first connecting sub-pipe 21 is located in the resin vat 10, and a second end of the first connecting sub-pipe 21 is connected to a liquid intake end of the first water pump 41. A first end of the second connecting sub-pipe 22 is connected to a liquid output end of the first water pump 41, and a second end of the second connecting sub-pipe 22 is connected to a liquid intake end of the first heat exchange sub-pipeline. A first end of the third connecting sub-pipe 31 is connected to a liquid output end of the first heat exchange sub-pipeline, and a second end of the third connecting sub-pipe 31 is located in the resin vat 10.

Further, the temperature adjusting device includes a refrigeration module. The refrigeration module includes a cooling block 51 and a refrigeration component. The cooling block 51 is provided on a first side of the first heat exchange sub-pipeline, and the refrigeration component is provided on a second side of the first heat exchange sub-pipeline.

Figure 2:
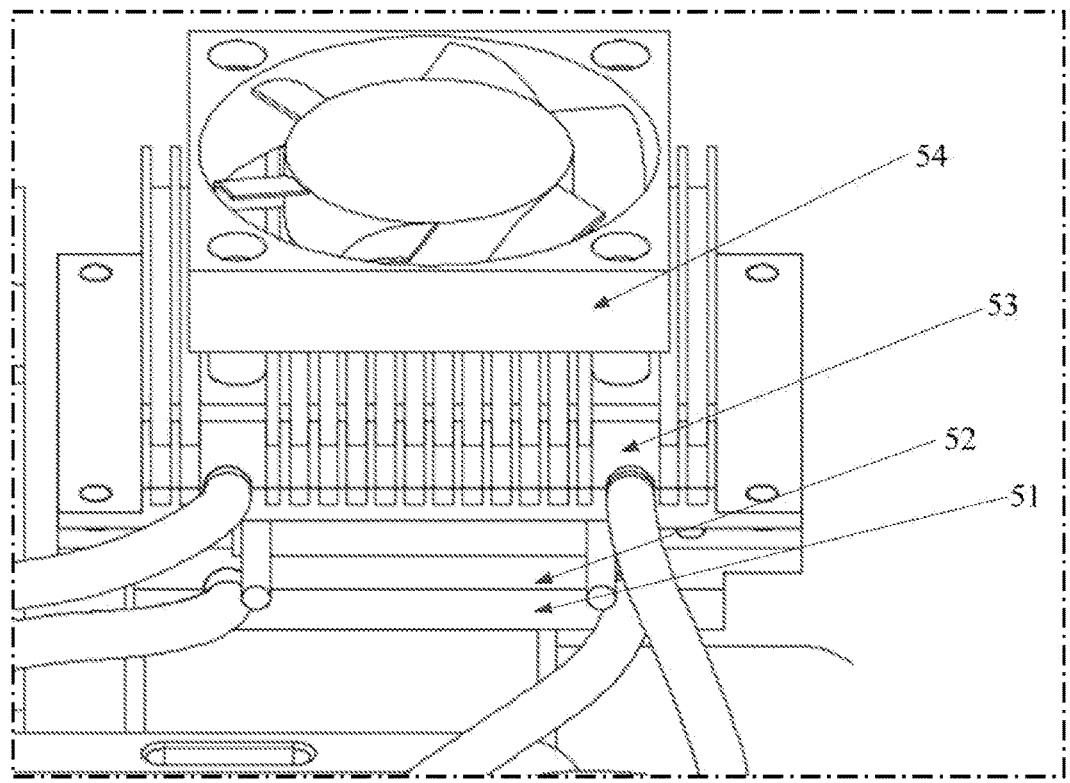
FIG. 2 is an enlarged view of an area "V" in FIG. 1, which shows a structural diagram of a temperature adjusting device provided by an embodiment of the present invention.

Referring to FIG. 2, in this embodiment, the temperature adjusting device includes a refrigeration module. The refrigeration module includes a cooling block 51 and a refrigeration component. A first heat exchange sub-pipeline is provided between the cooling block 51 and the refrigeration component, and the first heat exchange sub-pipeline is attached to the refrigeration component and the cooling block 51. In this way, when the resin liquid circulates in the first heat exchange sub-pipeline, the cooling block 51 and the refrigeration component cool the resin liquid flowing in the first heat exchange sub-pipeline.

The feeding power unit includes the first water pump 41. When the temperature of the resin liquid is higher than the preset temperature, the controller drives the first water pump 41, the first water pump 41 pumps the resin liquid from the resin vat 10 to deliver the resin liquid to the first heat exchange sub-pipeline such that the resin liquid is cooled, and the resin liquid with a reduced temperature flows back to the resin vat 10 through the third connecting sub-pipe 31, thereby realizing a reduction of the temperature of the resin liquid in the resin vat 10.

Further, the refrigeration component includes a refrigeration side of a semiconductor 52, and the semiconductor 52 is composed of at least two different semiconductor materials.

In this embodiment, one optional way is that the refrigeration component may be the refrigeration side of the semiconductor 52. The semiconductor 52 may be a refrigeration sheet, which may be composed of at least two different semiconductor materials. In this way, when the refrigeration sheet is powered on, a first side of the refrigeration sheet absorbs heat to realize a cooling effect, and this side is called a refrigeration side of the refrigeration sheet; and a second side of the refrigeration sheet releases heat to realize a heating effect, and this side is called a heating side.

Another optional way is that the refrigeration component may also be other components that can achieve a refrigeration effect, and this embodiment will not be described in detail by way of example herein.

Further, the feeding power unit includes a second water pump 42 provided at the outer wall of the resin vat 10, the heat exchange pipeline includes a second heat exchange sub-pipeline, the first connecting pipe includes a fourth connecting sub-pipe 23 and a fifth connecting sub-pipe 24, and the second connecting pipe includes a sixth connecting sub-pipe 32. A first end of the fourth connecting sub-pipe 23 is located in the resin vat 10, and a second end of the fourth connecting sub-pipe 23 is connected to a liquid intake end of the second water pump 42. A first end of the fifth connecting sub-pipe 24 is connected to a liquid output end of the second water pump 42, and a second end of the fifth connecting sub-pipe 24 is connected to a liquid intake end of the second heat exchange sub-pipeline. A first end of the sixth connecting sub-pipe 32 is connected to a liquid output end of the second heat exchange sub-pipeline, and a second end of the sixth connecting sub-pipe 32 is located in the resin vat 10.

Further, the temperature adjusting device includes a heating module. The heating module includes a heat sink 53, a fan 54 and a heating component. The heating component is provided on a first side of the second heat exchange sub-pipeline, the heat sink 53 is provided on a second side of the second heat exchange sub-pipeline, the fan 54 is provided on a side of the heat sink 53 away from the second heat exchange sub-pipeline, and the side of the heat sink 53 away from the second heat exchange sub-pipeline has a relief shape.

Referring to FIG. 2, in this embodiment, the temperature adjusting device includes a heating module. The heating module includes a heat sink 53, a fan 54 and a heating component. A second heat exchange sub-pipeline is provided between the heat sink 53 and the heating component, and the second heat exchange sub-pipeline is attached to the heat sink 53 and the heating component. In this way, when the resin liquid circulates in the second heat exchange sub-pipeline, the heat sink 53 and the heating component heat the resin liquid flowing in the second heat exchange sub-pipeline.

As shown in FIG. 2, the fan 54 is further provided on the side of the heat sink 53 away from the second heat exchange sub-pipeline, the fan 54 is configured to dissipate heat from the heat sink 53 to prevent the temperature of the resin liquid in the second heat exchange sub-pipeline being too high, thereby reducing the printing effect.

The feeding power unit includes a second water pump 42. When the temperature of the resin liquid is lower than the preset temperature, the controller drives the second water pump 42, the second water pump 42 pumps the resin liquid from the resin vat 10 to deliver the resin liquid to the second heat exchange sub-pipeline such that the resin liquid is heated, the resin liquid with an increased temperature flows back to the resin vat 10 through the sixth connecting sub-pipe 32, thereby realizing an increase in the temperature of the resin liquid in the resin vat 10.

Further, the heating component includes a heating side of a semiconductor 52, and the semiconductor 52 is composed of at least two different semiconductor materials.

In this embodiment, one optional way is that the heating component may be the heating side of the semiconductor 52. The semiconductor 52 may be a refrigeration sheet, which may be composed of at least two different semiconductor materials. In this way, when the refrigeration sheet is powered on, a first side of the refrigeration sheet absorbs heat to realize a cooling effect, and this side is called a refrigeration side of the refrigeration sheet; and a second side of the refrigeration sheet releases heat to realize a heating effect, and this side is called a heating side.

Another optional way is that the heating component may also be other components that can achieve a heating effect, and this embodiment will not be described in detail by way of example herein.

In one embodiment, the controller may be installed with embedded software that can use a proportional integral differential (PID) algorithm to drive, according to the temperature detected by the temperature sensor, the first water pump 41 and the second water pump 42 to work at the same time. In this case, part of the resin liquid in the resin vat 10 is pumped by the first water pump 41 to the first heat exchange sub-pipeline for being subjected to cooling, and part of the resin liquid in the resin vat 10 is pumped by second water pump 42 to the second heat exchange sub-pipeline for being subjected to heating. With the PID algorithm, the controller controls, according to the preset temperature and the temperature of the resin liquid detected by the temperature sensor, the power of the first water pump 41 to limit the flow rate of the resin liquid for being subjected to cooling, and the power of the second water pump 42 to limit the flow rate of the resin liquid for being subjected to heating, such that the temperature of the resin liquid reaches the preset temperature.

An embodiment of the present invention further provides a 3D printer. The 3D printer includes the feeding device as described above, and the structure of the feeding device can refer to the above embodiments, and the details are not repeated herein. In this embodiment, since the feeding device in the above embodiments is adopted, the 3D printer provided in the embodiment of the present invention has the same beneficial effects as those of the feeding device in the above embodiments.

The foregoing description merely relates to the specific embodiments of the present invention, but the scope of protection of the present invention is not limited thereto. Any changes or replacements that can be easily conceived by those skilled in the art within the technical scope disclosed by the present invention shall fall within the scope of protection of the present invention. Therefore, the scope of protection of the present invention shall be subject to the scope of protection of the claims.

What is claimed is:

1. A feeding device, comprising:
   a first connecting pipe;
   a second connecting pipe;
   a feeding power unit;
   a temperature adjusting device; and
   a resin vat configured to contain resin liquid,
   wherein the temperature adjusting device comprises a refrigeration component and a heat exchange pipeline, a liquid intake end of the heat exchange pipeline is connected to a first end of the first connecting pipe, a liquid output end of the heat exchange pipeline is connected to a first end of the second connecting pipe, a second end of the first connecting pipe and a second end of the second connecting pipe are both located in the resin vat, and at least one of the first connecting pipe and the second connecting pipe is provided with the feeding power unit, wherein the refrigeration component includes a semiconductor composed of at least two different semiconductor materials, wherein the refrigeration component comprises a refrigeration side of the semiconductor and a heating side of the semiconductor opposing the refrigeration side, and wherein the refrigeration component is configured to absorb heat at the refrigeration side of the refrigeration component and to release the heat from the heating side of the refrigeration component opposing the refrigeration side of the refrigeration component, and
   in response to a temperature of the resin liquid being higher than a preset temperature, the feeding power unit is configured to deliver the resin liquid from the resin vat to the heat exchange pipeline through the first connecting pipe to cool the resin liquid on the refrigeration side of the refrigeration component to obtain a cooled resin liquid, and is configured to deliver the cooled resin liquid back to the resin vat through the second connecting pipe,
   in response to the temperature of the resin liquid being lower than the preset temperature, the feeding power unit is configured to deliver the resin liquid from the resin vat to the heat exchange pipeline through the first connecting pipe to heat the resin liquid on the heating side of the refrigeration component to obtain a heated resin liquid, and is configured to deliver the heated resin liquid back to the resin vat through the second connecting pipe.

2. The feeding device according to claim 1, wherein the feeding power unit comprises a first liquid pump provided at an outer wall of the resin vat, the heat exchange pipeline comprises a first heat exchange sub-pipeline, the first connecting pipe comprises a first connecting sub-pipe and a second connecting sub-pipe, and the second connecting pipe comprises a third connecting sub-pipe;
   a first end of the first connecting sub-pipe is located in the resin vat, and a second end of the first connecting sub-pipe is connected to a liquid intake end of the first liquid pump;
   a first end of the second connecting sub-pipe is connected to a liquid output end of the first liquid pump, and a second end of the second connecting sub-pipe is connected to a liquid intake end of the first heat exchange sub-pipeline; and
   a first end of the third connecting sub-pipe is connected to a liquid output end of the first heat exchange sub-pipeline, and a second end of the third connecting sub-pipe is located in the resin vat.

3. The feeding device according to claim 2, wherein the temperature adjusting device comprises a refrigeration module comprising a cooling block and ft-said refrigeration component, wherein
   the cooling block is provided on a first side of the first heat exchange sub-pipeline, and the refrigeration component is provided on a second side of the first heat exchange sub-pipeline.

4. The feeding device according to claim 1, wherein the feeding power unit comprises a second liquid pump provided at an outer wall of the resin vat, the heat exchange pipeline comprises a second heat exchange sub-pipeline, the first connecting pipe comprises a fourth connecting sub-pipe and a fifth connecting sub-pipe, and the second connecting pipe comprises a sixth connecting sub-pipe;
   a first end of the fourth connecting sub-pipe is located in the resin vat, and a second end of the fourth connecting sub-pipe is connected to a liquid intake end of the second liquid pump;
   a first end of the fifth connecting sub-pipe is connected to a liquid output end of the second liquid pump, and a second end of the fifth connecting sub-pipe is connected to a liquid intake end of the second heat exchange sub-pipeline; and a first end of the sixth connecting sub-pipe is connected to a liquid output end of the second heat exchange sub-pipeline, and a second end of the sixth connecting sub-pipe is located in the resin vat.

5. The feeding device according to claim 4, wherein the temperature adjusting device comprises a heat sink and a fan, wherein
the heating side of the refrigeration component is provided on a first side of the second heat exchange sub-pipeline, the heat sink is provided on a second side of the second heat exchange sub-pipeline, the fan is provided on a side of the heat sink away from the second heat exchange sub-pipeline, and the side of the heat sink away from the second heat exchange sub-pipeline has a larger surface area than an opposing side of the heat sink.

6. The feeding device according to claim 1, wherein the feeding device further comprises a temperature sensor provided at an outer wall of the resin vat, wherein
the temperature sensor is configured to detect the temperature of the resin liquid in the resin vat.

7. The feeding device according to claim 6, wherein the feeding device further comprises a controller in communication connection with the temperature sensor and the feeding power unit, wherein
the controller is configured to obtain the temperature detected by the temperature sensor; and
when the temperature of the resin liquid is higher or lower than the preset temperature, the feeding power unit is driven.

8. A 3D printer, comprising a feeding device according to claim 1.

9. The 3D printer according to claim 8, wherein the feeding power unit comprises a first liquid pump provided at an outer wall of the resin vat, the heat exchange pipeline comprises a first heat exchange sub-pipeline, the first connecting pipe comprises a first connecting sub-pipe and a second connecting sub-pipe, and the second connecting pipe comprises a third connecting sub-pipe;
a first end of the first connecting sub-pipe is located in the resin vat, and a second end of the first connecting sub-pipe is connected to a liquid intake end of the first liquid pump;
a first end of the second connecting sub-pipe is connected to a liquid output end of the first liquid pump, and a second end of the second connecting sub-pipe is connected to a liquid intake end of the first heat exchange sub-pipeline; and
a first end of the third connecting sub-pipe is connected to a liquid output end of the first heat exchange sub-pipeline, and a second end of the third connecting sub-pipe is located in the resin vat.

10. The 3D printer according to claim 9, wherein the temperature adjusting device comprises a refrigeration module comprising a cooling block and said refrigeration component, wherein
the cooling block is provided on a first side of the first heat exchange sub-pipeline, and the refrigeration component is provided on a second side of the first heat, exchange sub-pipeline.

11. The 3D printer according to claim 8, wherein the feeding power unit comprises a second liquid pump provided at an outer wall of the resin vat, the heat exchange pipeline comprises a second heat exchange sub-pipeline, the first connecting pipe comprises a fourth connecting sub-pipe and a fifth connecting sub-pipe, and the second connecting pipe comprises a sixth connecting sub-pipe;
a first end of the fourth connecting sub-pipe is located in the resin vat, and a second end of the fourth connecting sub-pipe is connected to a liquid intake end of the second liquid pump;
a first end of the fifth connecting sub-pipe is connected to a liquid output end of the second liquid pump, and a second end of the fifth connecting sub-pipe is connected to a liquid intake end of the second heat exchange sub-pipeline; and
a first end of the sixth connecting sub-pipe is connected to a liquid output end of the second heat exchange sub-pipeline, and a second end of the sixth connecting sub-pipe is located in the resin vat.

12. The 3D printer according to claim 11, wherein the temperature adjusting device comprises a heat sink and a fan, wherein
the heating side of the refrigeration component is provided on a first side of the second heat exchange sib-pipeline, the heat sink is provided on a second side of the second heat exchange sub-pipeline, the fan is provided on a side of the heat sink away from the second heat exchange sub-pipeline, and the side of the heat sink away from the second heat exchange sub-pipeline has a larger surface area than an opposing side of the heat sink.

13. The 3D printer according to claim 8, wherein the feeding device further comprises a temperature sensor provided at an outer wall of the resin vat, wherein
the temperature sensor is configured to detect the temperature of the resin liquid in the resin vat.

14. The 3D printer according to claim 13, wherein the feeding device further comprises a controller in communication connection with the temperature sensor and the feeding power unit, wherein
the controller is configured to obtain the temperature detected by the temperature sensor; and
when the temperature of the resin liquid is higher or lower than the preset temperature, the feeding power unit is driven.

* * * * *

UNITED STATES PATENT AND TRADEMARK OFFICE
CERTIFICATE OF CORRECTION

| | |
|---|---|
| PATENT NO. | : 11,660,816 B2 |
| APPLICATION NO. | : 17/449267 |
| DATED | : May 30, 2023 |
| INVENTOR(S) | : Chengli Zhou and Xin Ouyang |

It is certified that error appears in the above-identified patent and that said Letters Patent is hereby corrected as shown below:

On the Title Page

Item (54) and in the Specification, Column 1, Lines 1-3, should read --FEEDING DEVICE AND 3D PRINTER-- instead of REGULATING RESIN TEMPERATURE BY RECIRCULATING ON HOT OR COLD SIDE OF PELTIER EFFECT BLOCK.

Signed and Sealed this
Twenty-first Day of November, 2023

Katherine Kelly Vidal
*Director of the United States Patent and Trademark Office*